(12) United States Patent
Stuecke et al.

(10) Patent No.: US 7,737,785 B2
(45) Date of Patent: Jun. 15, 2010

(54) AMPLIFIER CIRCUIT WITH ADJUSTABLE AMPLIFICATION

(75) Inventors: Thomas Stuecke, München (DE); Niels Christoffers, Dulsburg (DE); Stephan Kolnsberg, Krefeld (DE); Rainer Kokozinski, Oberhausen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 78 days.

(21) Appl. No.: 11/997,009

(22) PCT Filed: Jul. 29, 2005

(86) PCT No.: PCT/EP2005/008269

§ 371 (c)(1),
(2), (4) Date: May 29, 2008

(87) PCT Pub. No.: WO2007/014572

PCT Pub. Date: Feb. 8, 2007

(65) Prior Publication Data

US 2008/0231371 A1 Sep. 25, 2008

(51) Int. Cl.
*H03G 3/30* (2006.01)
(52) U.S. Cl. .................................. 330/284; 330/283
(58) Field of Classification Search .............. 330/144, 330/284, 285, 283
See application file for complete search history.

(56) References Cited

U.S. PATENT DOCUMENTS

| | | | |
|---|---|---|---|
| 3,036,275 A | 5/1962 | Harmer | |
| 3,872,395 A | 3/1975 | Holland | |
| 3,990,019 A | 11/1976 | Crockett et al. | |
| 5,530,404 A | 6/1996 | Debroux | |
| 6,226,322 B1 | 5/2001 | Mukherjee | |
| 6,545,534 B1 | 4/2003 | Mehr | |
| 6,621,346 B1 | 9/2003 | Nabicht et al. | |
| 2005/0012553 A1* | 1/2005 | Mondal et al. | 330/282 |

FOREIGN PATENT DOCUMENTS

| | | |
|---|---|---|
| WO | 2004/015859 A2 | 2/2004 |
| WO | 2004/064250 A1 | 7/2004 |

OTHER PUBLICATIONS

Official communication issued in the International Application No. PCT/EP2005/008269 mailed on May 17, 2006.
English translation of the official communication issued in counterpart International Application No. PCT/EP2005/008269, mailed on Jun. 19, 2008.

* cited by examiner

*Primary Examiner*—Steven J Mottola
(74) *Attorney, Agent, or Firm*—Keating & Bennett, LLP (57) ABSTRACT

An amplifier circuit has an amplifier element having an amplifier element input and an amplifier element input impedance, an amplification adjuster adapted to adjust an amplification of the amplifier element, an amplifier circuit input coupled to the amplifier element input, an impedance element having a alterable impedance value and being coupled to the amplifier circuit input, and an impedance adjuster adapted to adjust the impedance value of the impedance element as a function of the amplification of the amplifier element.

14 Claims, 7 Drawing Sheets

AMPLIFIER CIRCUIT WITH ADJUSTABLE AMPLIFICATION

TECHNICAL FIELD

The present invention relates to an amplifier circuit with adjustable amplification, and in particular to an amplifier circuit with an input impedance.

BACKGROUND

Amplifiers have increasingly been employed in electrical devices which have the requirement of being as low in noise as possible placed upon them. For example, in receivers for wireless systems, such as mobile phones, a low-noise amplifier, or LNA, is employed at the input of the receivers. In this context, it is the task of the LNA to amplify a very weak input signal while adding as little additional noise as possible to the signal, so that a signal having as small a noise portion as possible will result at the output of the LNA.

If a high signal is present at an input of the amplifier or LNA, this may cause subsequent amplifier stages to become saturated. In this manner, a signal amplified by the amplifier stages may then be distorted such that, for example, in a system of several amplifier stages, a bit error rate, or BER, will be increased on the receiver side, or a signal quality will be reduced.

Figure 6:
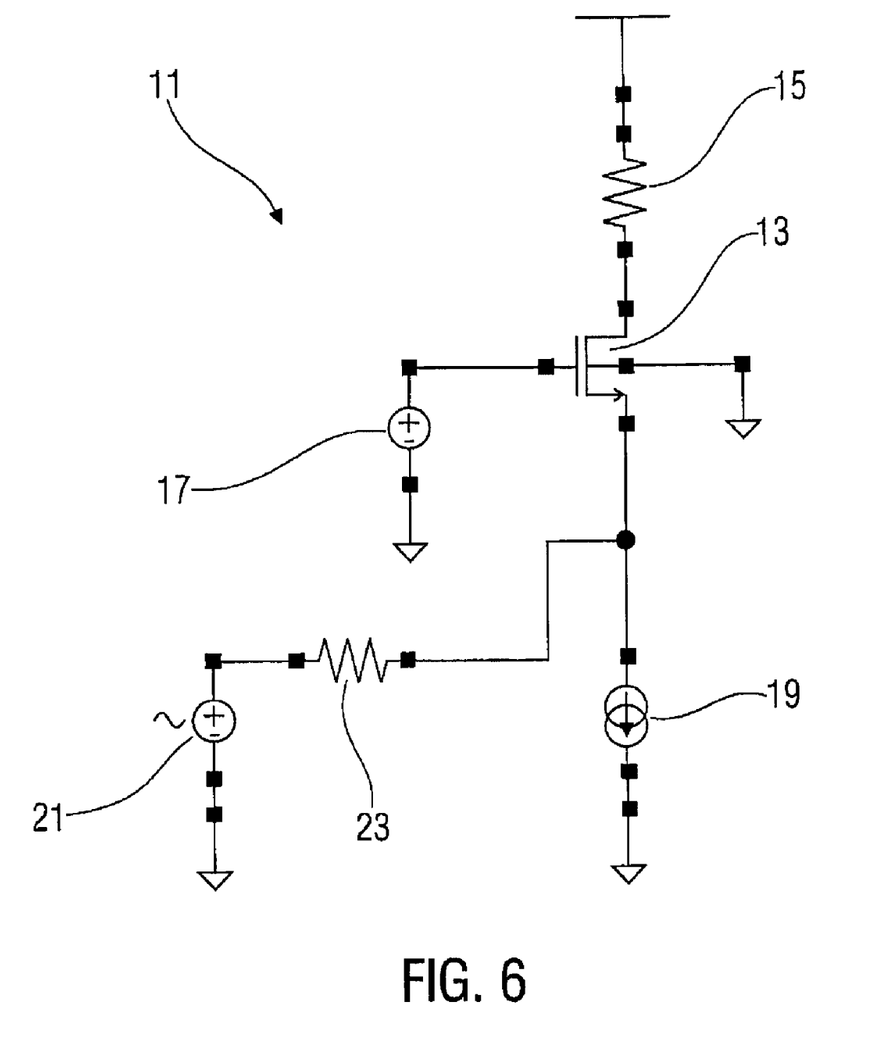
FIG. 6 shows a potential common-gate LNA.

FIG. 6 shows a potential low-noise amplifier. The low-noise amplifier is configured as a potential common-gate LNA 11, or CG LNA 11.

The common-gate LNA 11, or common-gate terminal LNA, in this context comprises a field-effect transistor 13, a load impedance 15, an operating-point voltage source 17, an operating-point constant current source 19, an input voltage source 21, and an impedance 23 of the input voltage source.

The drain terminal of the field-effect transistor 13 is connected to a supply voltage terminal via the load impedance 15. A gate terminal, or control terminal, of the field-effect transistor 13 is coupled to a ground terminal via the operating-point voltage source 17. A bulk terminal, or substrate terminal, of the field-effect transistor 13 is also connected to a ground terminal. The operating-point constant current source 19 is connected, at a first terminal, to the source terminal of the field-effect transistor 13 and, at a second terminal, to a ground terminal. A first terminal of the input voltage source 21 is connected in an electrically conducting manner to the source terminal of the field-effect transistor 13 via the impedance 23 of the input voltage source. At the same time, a second terminal of the input voltage source 21 is connected to a ground terminal.

The operating-point constant current source 19 specifies an operating point of the potential common-gate LNA 11, the DC component which flows through the load impedance 15 approximating the current of the operating-point constant current source 19. The operating-point voltage source 17 adjusts a potential difference between the source terminal and the gate terminal of the field-effect transistor 13, so that the constant current from the operating-point constant current source 19 may flow through the field-effect transistor 13.

Upon application of an AC voltage signal from the input voltage source 21, a potential difference between the gate terminal of the field-effect transistor 13 and the source terminal of the field-effect transistor 13 will vary, as a result of which the current flowing through the load impedance 15 will vary.

The amplification of the common-gate LNA 11, or common-gate terminal LNA, is determined, in a first approximation, by the load resistance, or the load impedance, 15 Zload and by a transconductance gm of the LNA MOSFET, or metal oxide semiconductor field-effect transistor, which depends on the specified operating point of the field-effect transistor 13. In addition, the transconductance gm specifies the input impedance of the potential common-gate LNA 11.

In order to avoid reflections, the input impedance is adapted to the impedance of the preceding stage, such as a source of an antenna, a filter, etc. This adaptation is referred to as matching, or input matching.

In order to reduce the amplification of the common-gate LNA 11, the load impedance 15 commonly has an additional resistor, such as a MOSFET, connected in parallel therewith. If the load impedance 15 consists, in this context, of a resonant circuit, such as a load coil at a drain terminal of the MOSFET or field-effect transistor 13, a parasitic capacitance of the field-effect transistor 13, and an input capacitance of the follower stage, the resistor connected in parallel will reduce the quality of the circuit and thus increase the bandwidth of the circuit. This increase in bandwidth is frequently undesired and disadvantageous.

What is unfavorable or disadvantageous about the potential common-gate LNA 11 shown in FIG. 6 is that the input impedance of the potential common-gate LNA 11 will change as a result of a change in the DC operating-point current, or direct current operating-point current, which is mainly supplied by the constant current source 19. This is why the DC operating-point current frequently is not changed so as to adjust the transconductance gm and, thus, the amplification. Instead, an additional resistor is advantageously connected in parallel, as was already mentioned above.

In this context, an input impedance Zin is roughly reciprocal to the transconductance gm. Here, the following connection applies:

$$Z_{in} \approx \frac{1}{g_m} \qquad (1)$$

In this context, the amplification of the circuit 11 may be determined from the formula below.

$$G_v \approx \left|\frac{u_{out}}{u_s}\right| = \frac{g_m \cdot Z_{load}}{1 + g_m \cdot Z_S} \qquad (2)$$

In the above formula, a factor $G_v$ is an amplification of the common-gate LNA 11, a variable $u_{out}$ is an amplitude of an AC voltage component of the output signal, $u_s$ is an amplitude of an AC voltage of the input source 21, $Z_{load}$ is an impedance value of the load impedance 15, and $Z_S$ is an impedance value of the impedance 23 of the input voltage source.

In an input matching, wherein the input impedance $Z_{in}$ of the LNA circuit equals the impedance of the input voltage source $Z_S$, the following connection will then apply:

$$G_v \approx \frac{g_m \cdot Z_{load}}{2} \qquad (3)$$

Figure 7:
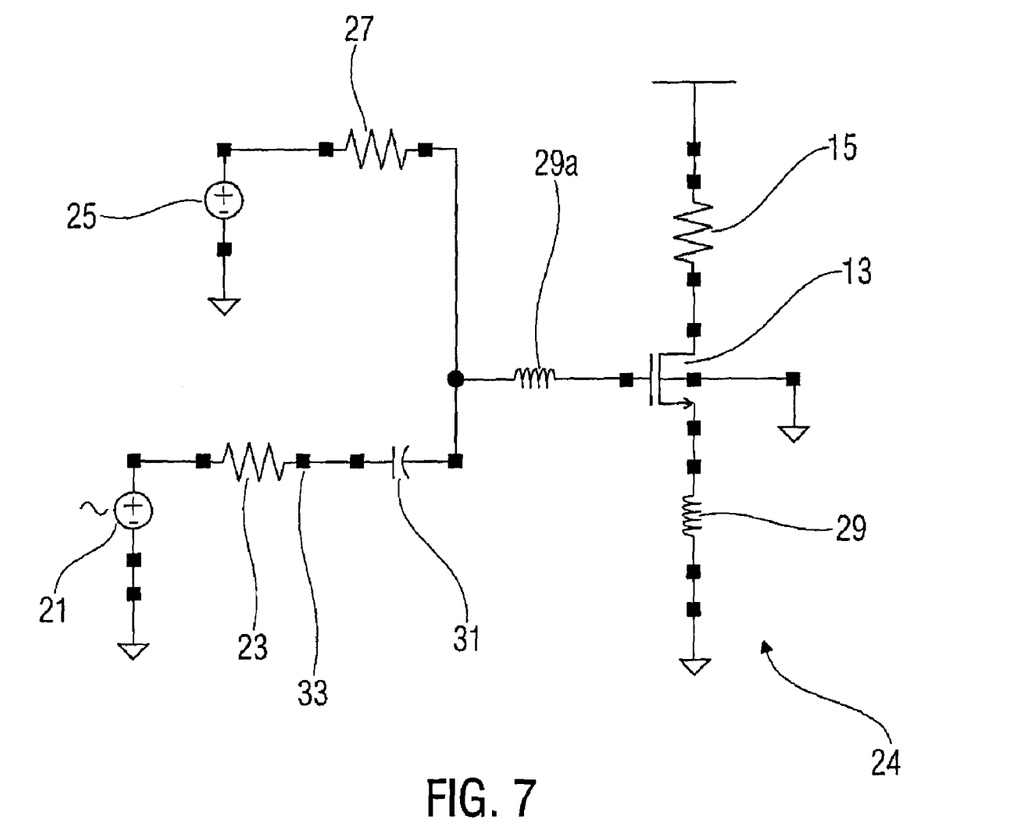
FIG. 7 shows a potential common-source LNA.

FIG. 7 shows a potential common-source LNA 24, or CS LNA. In the following, elements which are identical or have identical actions will be designated with the same reference numerals. In addition, in the potential common-source LNA 24 shown in FIG. 7, only the differences relative to the common-gate LNA 11 shown in FIG. 6 will be discussed. Unlike the potential common-gate LNA 11 shown in FIG. 6, the potential common-source LNA 24 shown in FIG. 7 comprises a BIAS resistor 27, a source inductance 29, a gate inductance 29a, and a coupling capacitor 31.

Unlike the common-gate LNA 11 shown in FIG. 6, in the potential common-source LNA 24 shown in FIG. 7, the source terminal of the field-effect transistor 13 is connected to a ground terminal via the source inductance 29. In addition, a voltage source 25 for specifying the operating point is connected to the gate terminal of the field-effect transistor 13 via the gate inductance 29a by means of the BIAS resistor 27. At the same time, in the potential common-source LNA 24 shown in FIG. 7, the input voltage source 21 is connected, via the impedance 23 of the input voltage source, to an input terminal 33 of the common-source LNA 24. The input terminal 33 of the common-source LNA 24 is coupled to the gate terminal of the field-effect transistor 13 via a coupling capacitor 31 and the gate inductance 29a.

The source inductance 29 and the gate inductance 29a serve to eliminate the complex components of a gate/source capacitance in the input impedance Zin at a predetermined frequency, so that the input impedance will only comprise active components. This connection will be explained in more detail below. The voltage source 25 for specifying the operating point specifies a potential difference between the gate terminal of the field-effect transistor 13 and the source terminal of the field-effect transistor 13, and adjusts the operating point of the field-effect transistor 13 and, thus, an amplification of the potential common-source LNA 24. The coupling capacitor 31 serves to filter out potential DC signal components, or DC components.

Depending on the AC voltage signal of the input voltage source 21, a potential difference between the gate terminal of the field-effect transistor 13 and the source terminal of the field-effect transistor 13 will change, and thus the current flowing through the field-effect transistor 13 between the source terminal and the drain terminal will also change. This change in the current flowing through the field-effect transistor 13 leads to a change in the current flowing through the load impedance 15, and thus to a change in the output voltage. The AC voltage signal from the input voltage source 21 is thus amplified by the potential common-source LNA 24.

The input impedance of the potential common-source LNA 24 may be calculated from the formula:

$$Z_{in} = r_{g,NQS} + \frac{g_m \cdot L_s}{C_{gs}} + \frac{1}{sC_{gs}} + s[L_s + L_g] \quad (4)$$

In the above formula, $Z_{in}$ represents a value of the input impedance, and $r_{g,NQS}$ represents a so-called non-quasi static resistance. A variable $L_s$ represents a value of the source inductance 29, whereas a variable $C_{gs}$ represents the gate/source capacitance. A Laplace variable s may be equated with a complex angular frequency jω or j2πf. In addition, a variable $L_g$ represents the gate inductance.

If a condition of a so-called input matching is met, i.e. if the value of the input impedance $Z_{in}$ equals the value of the impedance 23 of the input voltage source, the following connection will apply:

$$Z_{in} = Z_S = r_{g,NQS} + \frac{g_m \cdot L_s}{C_{gs}} \quad (5)$$

A precondition for the above connection in the input matching is that the magnitudes of the terms $1/sC_{gs}$ and $s[L_s + L_g]$ be equal, so that no reactance components will occur in the input impedance $Z_{in}$.

The connection $$r_{g,NQS} = \frac{1}{\kappa \cdot g_m} \quad (6)$$

applies to the so-called non-quasi static resistance. In this context, κ is a so-called Elmore constant, which here has the value of 5. The amplification of the circuit will then result from the following connection:

$$G_v = \left| \frac{u_{out}}{u_s} \right| = \frac{1}{2} \cdot \frac{g_m}{\omega \cdot C_{gs}} \cdot \frac{Z_{load}}{Z_S} \quad (7)$$

In the above formula, a variable ω symbolizes the magnitude of the angular frequency 2πf.

The low-noise amplifier circuits shown in FIG. 6 and FIG. 7 have the task of amplifying very weak input signals while adding as low a noise as possible to the signal amplified. If a high signal is present at the input of the LNA, this may cause subsequent stages to become saturated. This may lead to an increase in the bit error rate, or BER, of the system. With very large input signals, the amplification of the LNA will therefore be reduced.

In this context, in the potential common-gate LNA 11, the specification of the operating point, and thus the amplification, could be changed by a change in the DC operating-point current. Thus, in the event that a large signal which is provided by a preceding stage such as a filter is present at the input of the LNA, the amplification may be reduced, so that the subsequent stages will not become saturated. However, this would entail a change in the input impedance. This change in the input impedance, in turn, would result in that for the input voltage source 21 with the impedance 23 of the input voltage source, and for the LNA circuit, or the potential common-gate LNA 11, the condition of input matching is no longer met.

In this context, reflections of the signal provided by the input voltage source 21 could then occur at the potential common-gate LNA 11.

SUMMARY

According to an embodiment, an amplifier circuit may have: an amplifier element having an amplifier element input; an amplifier adjuster adapted to adjust an amplification of the amplifier element; an amplifier circuit input coupled to the amplifier element input; an impedance element having a variable impedance value and being coupled to the amplifier circuit input; and an impedance adjuster adapted to adjust the impedance value of the impedance element as a function of the amplification of the amplifier element; the impedance adjuster being further adapted to determine an amplification indication value from which the amplification of the amplifier element may be determined, to look up, with the amplifier indication value, in a table having stored therein an association of amplification indication values with predetermined impedance values of the impedance element, so as to obtain from the table an impedance value which corresponds to the amplification indication value, and so as to adjust the impedance value to have the value obtained.

According to another embodiment, an amplifier circuit may have: an amplifier element having an amplifier element input; an amplifier adjuster adapted to adjust an amplification of the amplifier element; an amplifier circuit input coupled to the amplifier element input; an impedance element having a alterable impedance value and being coupled to the amplifier circuit input; and an impedance adjuster adapted to adjust the impedance value of the impedance element as a function of the amplification of the amplifier element; the alterable impedance element being coupled, at a first terminal of the alterable impedance element, to the amplifier element input, and is coupled, at a second terminal of the alterable impedance element, to a ground terminal or a supply voltage terminal; and the amplifier element having a field-effect transistor having a source terminal, a gate terminal, and a drain terminal, one of the source terminal or drain terminal being coupled to a load impedance, and the other of the source terminal or drain terminal forming the input of the amplifier element, and the gate terminal of the field-effect transistor (13) being coupled to a voltage source, and the amplification adjuster being further adapted to generate an amplification adjustment signal and to adjust, as a function of the adjustment signal, an operating-point current of the field-effect transistor and, thus, the amplification of the amplifier element, and the impedance adjuster being further adapted to receive the amplification adjustment signal, and to adjust the impedance value as a function of the amplification adjustment signal received.

According to another embodiment, an amplifier circuit may have: an amplifier element having an amplifier element input; an amplifier adjuster adapted to adjust an amplification of the amplifier element; an amplifier circuit input coupled to the amplifier element input; an impedance element having a variable impedance value and being coupled to the amplifier circuit input; and an impedance adjuster adapted to adjust the impedance value of the impedance element as a function of the amplification of the amplifier element, wherein the impedance element has a field-effect transistor, the impedance element is coupled, at a first terminal of the impedance element, to a gate terminal of the field-effect transistor, and is coupled, at a second terminal of the impedance element, to an input of the amplifier circuit, and the amplification adjuster is further adapted to generate an amplification adjustment signal and, as a function of the amplification adjustment signal, to adjust a potential difference between the gate terminal of the field-effect transistor and a ground or supply voltage potential and, thus, the amplification of the amplifier element, and wherein the impedance adjuster is further adapted to receive the amplification adjustment signal, and to adjust the impedance value as a function of the amplification adjustment signal received.

An amplifier circuit comprises an amplifier element having an amplifier element input and an amplifier element input impedance, an amplification adjustment means adapted to adjust an amplification of the amplifier element, an amplifier circuit input coupled to the amplifier element input, an impedance element comprising a alterable impedance value and being coupled to the amplifier circuit input, and an impedance adjustment means adapted to adjust the impedance value of the impedance element as a function of the amplification of the amplifier element.

The present invention is based on the finding that in an amplifier circuit, an impedance element adjustment means may be laid out such that as a function of an amplification, to be adjusted, of an amplifier element, it may adjust a alterable impedance value of an impedance element coupled to the input of the amplifier circuit in such a manner as to compensate for a change in the input impedance of the amplifier circuit as a function of the amplification.

Thus, amplifier circuits may be provided wherein the amplification may be adjusted while at the same time the change, resulting from the amplification, in the input impedance may be compensated for by readjusting the impedance value of the impedance element. In other words, amplifier circuits may thus be produced wherein on the one hand, the amplification may be readjusted, whereas on the other hand, the input impedance value of the amplifier circuit may be kept constant.

Thus, it is possible to adapt the amplification to a level of the input signal while at the same time maintaining the condition of the input matching. Reflections of the input signal at the input of the amplifier circuit can thus be avoided.

Here, amplifier circuits in accordance with an embodiment of the present invention may be provided wherein the input signal may comprise higher fluctuations than in the potential amplifier circuits. This enables a more flexible use of the amplifier circuits in accordance with an embodiment of the present invention.

BRIEF DESCRIPTION OF THE DRAWINGS

Embodiments of the present invention will be detailed subsequently referring to the appended drawings, in which.

DETAILED DESCRIPTION

Figure 1:
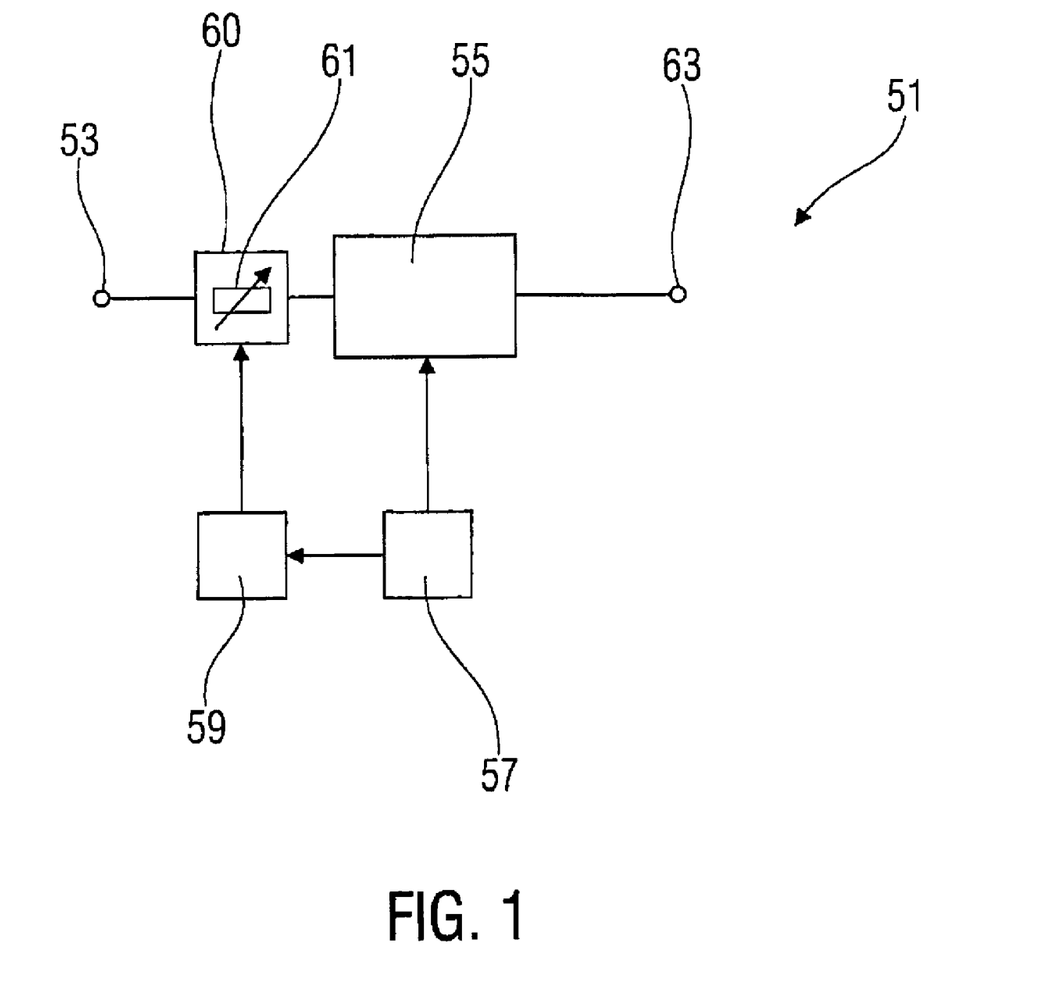
FIG. 1 shows an amplifier circuit in accordance with an embodiment of the present invention.

FIG. 1 shows an amplifier circuit 51 in accordance with an embodiment of the present invention. The amplifier circuit 51 comprises an input terminal 53 of the amplifier circuit 51, an amplifier element 55, an amplification adjustment means 57, an impedance adjustment means 59, a variable-impedance circuit 60 having a alterable impedance 61, and an output terminal 63.

The input terminal 53 of the amplifier circuit is connected in a conducting manner to the first terminal of the variable-impedance circuit 60, whereas a second terminal of the variable-impedance circuit 60 is connected to an input of the amplifier element 55. In this context, the variable-impedance circuit 60 may be implemented, for example, as a circuit, as will be shown below, wherein the impedance element 61 is directly connected between the input terminal 53 of the amplifier circuit and the input of the amplifier element 55, or as a circuit comprising a direct connection between the input terminal 53 and the input of the amplifier element 55 and being connected to ground via the impedance element 61. An output of the amplifier element 55 is connected in an electrically conducting manner to the output terminal 63 of the amplifier circuit. The amplification adjustment means 57 transmits a signal to the amplifier element 55, which adjusts the amplification of the amplifier element 55 as a function of the signal. In addition, the amplification adjustment means 57 transmits a signal to the impedance adjustment means 59, which adjusts an impedance value of the alterable impedance 61 via a control terminal of the variable-impedance circuit 60.

The amplifier element 55 amplifies a signal applied at its input which depends on a level of the signal applied at the input terminal 53, and generates an output signal at the output terminal 63.

The amplification adjustment means 57 may, in this context, determine, for example, a level of the signal applied at the input terminal 53, and subsequently adjust the amplification of the amplifier element 55. For example, the amplifier adjustment means 57 may reduce or decrease, in the event of a high level of the input signal at the input terminal, the amplification of the amplifier element 55, so that no distortion will occur in the stages following the amplifier circuit 51. However, due to the change in the amplification, the input impedance of the amplifier element 55 will change. The impedance adjustment means 59 therefore readjusts the value of the alterable impedance 61, as a function of the signal received from the amplifier adjustment means 57, such that the change in the input impedance of the amplifier element 55 will be compensated for. Thus, the input impedance at the input terminal 53 of the amplifier circuit 51 will remain constant, for example, even in the event of a change in the amplification of the amplifier element 55.

This results in that the condition of the input matching, stating that an output impedance of a preceding amplifier circuit, which comprises, for example, a filter, an antenna, or a source, be equal to the input impedance of the amplifier circuit 51, may be maintained even though the amplification of the amplifier element 55 is changed.

Figure 2:
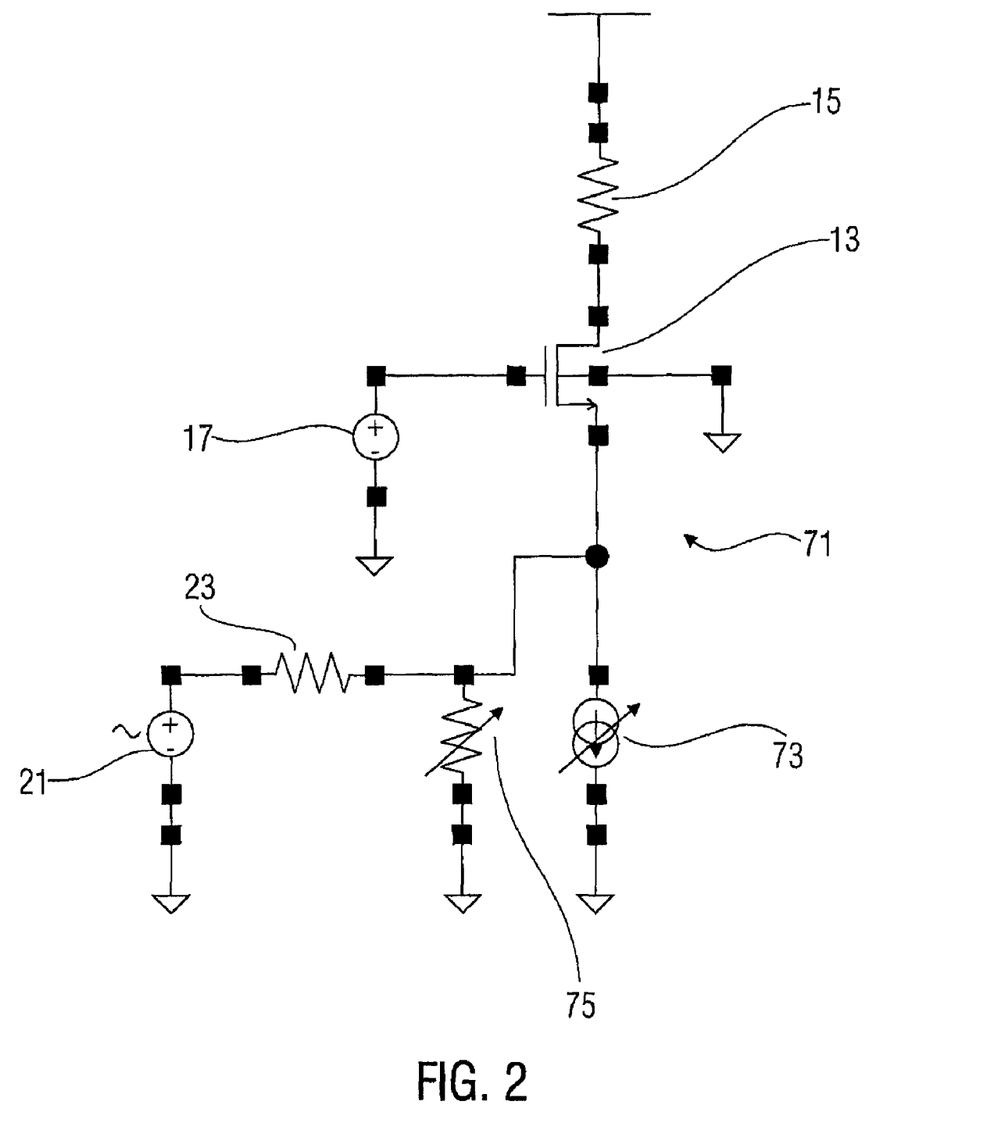
FIG. 2 shows a common-gate LNA in accordance with an embodiment of the present invention.

FIG. 2 shows a common-gate LNA 71 in accordance with an embodiment of the present invention. The differences relative to the potential common-gate LNA 11 shown in FIG. 6 will be discussed in the following description.

The operating-point constant current source 19 has been replaced by an adjustable constant current source 73 in the potential common-gate LNA 11. At the same time, a variable impedance 75 is connected between a ground terminal and the source terminal of the field-effect transistor 13.

A control means, not shown here, adjusts the adjustable constant current source 73 such as to adjust a value of the amplification of the field-effect transistor 13. In this context, in accordance with equation (3), the amplification of the circuit will be proportional to the transconductance gm which may be adjusted by a change in the current provided by the adjustable constant current source 73, and to the load impedance Zload 15.

In the event of a reduction of the transconductance gm by a respective change in the current provided by the adjustable constant current source 73, the amplification of the common-gate LNA 71 may be reduced, for example, without the bandwidth of the circuit being changed. Since in the common-gate LNA 71, shown in FIG. 2, in accordance with an embodiment of the present invention, the input impedance of the common-gate LNA 71 is determined by the transconductance gm, as is explained in formula (I), the input impedance of the common-gate LNA 71 may be adapted, or changed—by adjusting the variable impedance 75, or the additional impedance, accordingly by the control means which is not shown here—such that the condition of the input matching may continue to be maintained even though the value of the transconductance gm changes.

In other words, a change in the input impedance of the common-gate LNA 71, which results from a change in the transconductance gm of the field-effect transistor 13, may be compensated for by a change in the value of the variable impedance 75.

As was already explained, the transconductance gm is determined by the DC operating-point current provided by the variable constant current source 73, said DC operating-point current being adjusted in accordance with the amplification desired. The DC working-point current and, thus, the amplification may be adjusted dynamically in this context, it also being possible to subsequently dynamically adapt the input impedance.

By additionally arranging the variable impedance 75 between the ground terminal and the source terminal of the field-effect transistor 13, a noise figure (NF) of the common-gate LNA 71 in accordance with an embodiment of the present invention increases, or is deteriorated, as compared with the potential common-gate LNA 11. However, since the common-gate LNA 71 in accordance with an embodiment of the present invention is able to amplify a significantly higher input signal, this additional noise component may be neglected. A signal component at the input of the common-gate LNA 71, or at the source terminal of the field-effect transistor 13, is now higher because of the larger signal, which is why the signal/noise ratio at the output of the common-gate LNA 71, or at the drain terminal of the field-effect transistor 13, becomes higher in the output signal as well.

The input impedance of the common-gate LNA 71 in accordance with an embodiment of the present invention may be determined by the following connection.

$$Z_{in} \approx \frac{1}{g_m} \| Z_{addition} = \frac{Z_{addition}}{1 + g_m \cdot Z_{addition}} \quad (8)$$

In the above formula, a variable $Z_{addition}$ represents a value of the variable impedance 75. In this context, the rule applies that the variable impedance is connected in parallel with the component of the input impedance which results from the reciprocal value of the transconductance. In addition, formula (8) reveals that a change in the transconductance $g_m$ may be compensated for by a respective change in the value of the variable $Z_{addition}$, so that, for example, a change in the input impedance $Z_{in}$ of the common-gate LNA will be reduced or eliminated.

The amplification of the common-gate LNA 71 may be calculated in accordance with the below formula:

$$G_v \approx \frac{g_m \cdot Z_{load}}{1 + g_m \cdot Z_S + \frac{Z_S}{Z_{addition}}} \quad (9)$$

$$= \frac{g_m \cdot Z_{load}}{1 + Z_S \cdot \frac{1 + g_m \cdot Z_{addition}}{Z_{addition}}}$$

$$= \frac{g_m \cdot Z_{load}}{1 + \frac{Z_S}{Z_{in}}}$$

The following connection shall then apply again in the condition of the input matching, or in the event that the value $Z_s$ of the impedance 23 of the input voltage source is equal to the input impedance $Z_{in}$ of the common-gate LNA 71 in accordance with an embodiment of the present invention:

$$G_v \approx \frac{g_m \cdot Z_{load}}{2} \quad (10)$$

Figure 3:
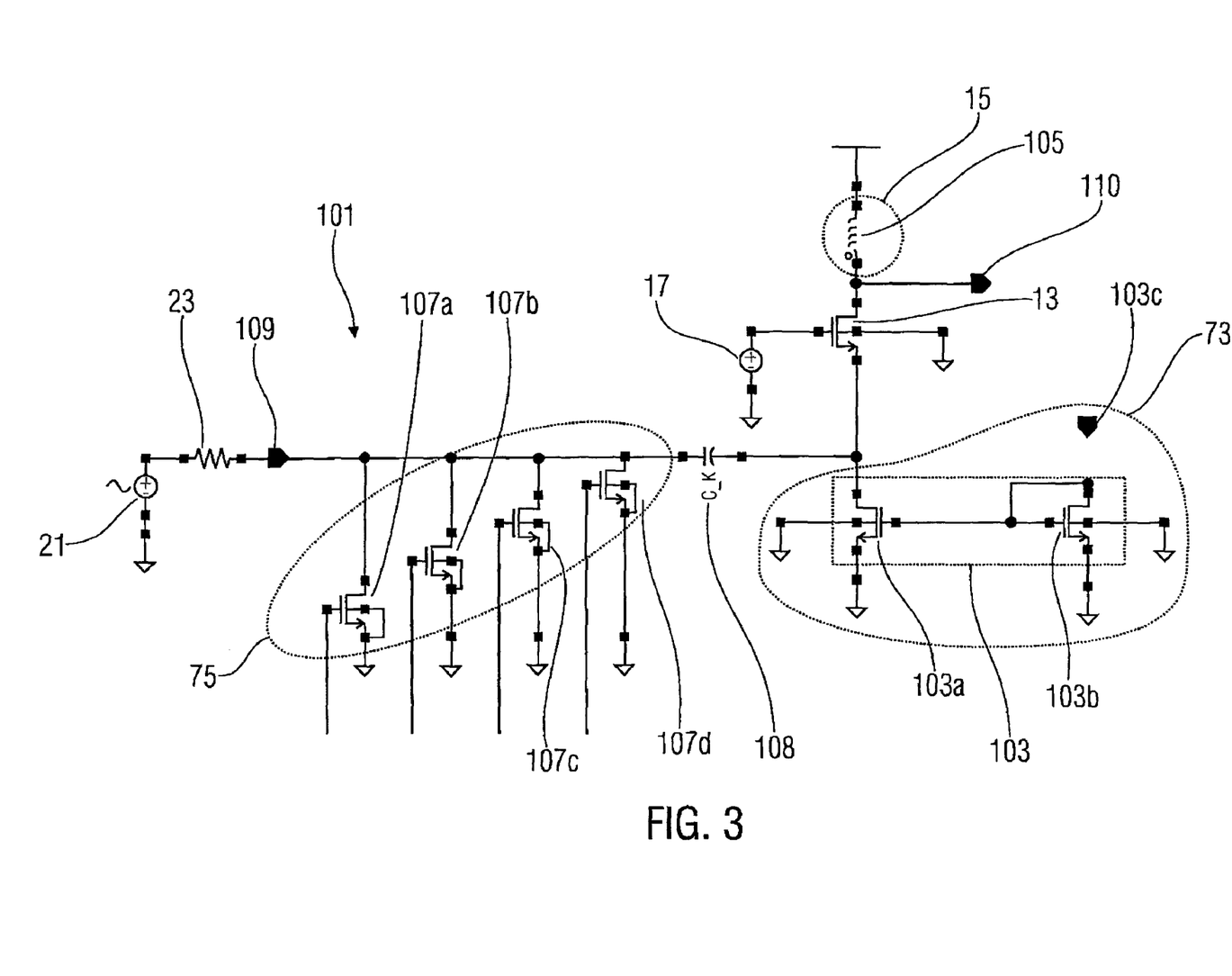
FIG. 3 shows a specific embodiment of the common-gate LNA in accordance with an embodiment of the present invention.

FIG. 3 shows a specific implementation 101 of the common-gate LNA 71 in accordance with an embodiment of the present invention. In the specific implementation 101 of the common-gate LNA, a current from a constant current source, not shown here, is coupled in at the bias terminal 103c by the current mirror circuit 103. The load impedance 15 is realized by a load inductance 105, and the variable impedance 75 by an arrangement of several MOSFETs 107a-d operated in the triode mode.

Each of the MOSFETs 107a-d is coupled, at a drain terminal, to a source terminal of the field-effect transistor 13 via a coupling capacitance 108. The coupling capacitance 108 represents a low impedance for high-frequency AC signals, and serves to filter out potential DC signal components, or DC components. Each of the MOSFETs 107a-d is connected, at a source terminal, to a ground terminal. In addition, bulk terminals of the MOSFETs 107a-d are shorted with the source terminals, respectively. At a gate terminal, each of the MOSFETs 107a-d is connected to an output of a control means which is not shown here.

The current mirror circuit 103 comprises a first current mirror field-effect transistor 103a and a second current mirror field-effect transistor 103b. A BIAS current fed in at a BIAS terminal 103c of the current mirror circuit here adjusts the operating point and, thus, the amplification of the common-gate LNA 101. The BIAS current fed in at the drain terminal of the current mirror field-effect transistor 103b is proportional to a drain current applied at a drain terminal of the current mirror field-effect transistor 103a and adjusting the operating point of the common-gate LNA 101. The principle here is based on the action of the current mirror circuit, wherein two field-effect transistors 103a, 103b are connected such that a current fed in at a drain terminal of the second current mirror field-effect transistor 103b is proportional to a current at a drain terminal of the first current mirror field-effect transistor 103a.

The adjustable impedance 75 is replaced by the parallel arrangement of the MOSFETs 107a-d, the MOSFETs here being operated in a triode mode. Here, the following connection applies to a drain/source resistor of the respective MOSFETs in the triode mode:

$$R_{DS,ON} \approx \frac{1}{\mu_n \cdot C_{OX} \cdot \frac{W}{L} \cdot (U_{GS} - U_t)} \tag{11}$$

In the above formula, a variable RDS,ON represents a resistance between a drain terminal and a source terminal of the MOSFET field-effect transistor, a variable µn represents mobility of the electrons, COX a capacitance between a gate terminal and the channel of the MOSFET per unit area, a variable W a width of the channel within the MOSFET, and a variable L an average length of the channel. In addition, a factor UGS represents a voltage between the gate terminal and the source terminal, and a factor Ut represents a threshold value of the voltage UGS, or the voltage between the gate terminal and the source terminal.

The control means, not shown here, adjusts a current at the BIAS terminal 103c of the current mirror circuit, thus adjusts the DC operating-point current, and applies a respective gain word to the control inputs, or gate terminals, of the four MOSFETs 107a-d.

By a suitable choice of a gain word at the gate terminals 107a-d, a desired amplification may be adjusted while keeping constant an input impedance of the common-gate LNA 101. Advantageously, the current consumption of the circuit will be reduced in the event of a lower amplification. The four MOSFETs in the triode mode are switched on as needed, so that different amplification adjustments may result at the respective DC operating-point currents 16. Switching the MOSFETs 107a-d is accomplished by applying a control voltage to the respective gate.

What is advantageous in this context is to dimension the MOSFETs such that the condition of the input matching is met, wherein the input impedance of the common-gate LNA 101 is adapted to the output impedance of an upstream amplifier stage, or to an internal impedance of a voltage source 21 applied at the input of the common-gate LNA.

In other words, the control means, not shown here, will determine, for example as a function of an output signal at an output terminal 109 of the common-gate LNA 101, a current which is to be fed in at the BIAS terminal of the current mirror circuit 103c, so as to achieve an amplification, as well as a gain word, which here consists of four bits, for example.

Depending on the logical values of the four bits, a logically high signal or a logically low signal is applied at the gate terminals of the MOSFETs 107a-d, respectively. Thus, each of the MOSFETs 107a-d will comprise, as a function of the level of the logical signal applied, a high resistance between the drain terminal and the source terminal, or a low resistance between the drain terminal and the source terminal of the MOSFETs 107a-d. Thus, 16 different impedance values may be adjusted in the adjustable impedance 75 arranged between a ground terminal and an input terminal 109 of the common-gate LNA 101 from the four MOSFETs 107a-d.

Advantageously, in this context, the adjustment of the operating point by the current at the BIAS terminal 103c is also performed by the selection of a values from 16 different potential values for the BIAS current. The control means, not shown here, will determine, as a function of an amplification, to be adjusted, of the common-gate LNA 101, a value, from a table, for a current at the BIAS terminal 103c, here, for example, from 16 potential values for a current at the BIAS terminal 103c, and a respective combination of four bits in the gain word. In the table, each value for the DC operating-point current, or the BIAS current to be fed in, has a combination of bits in the gain word associated with it. As a function of the respective bits in the gain word, the MOSFETs 107a-d will then be driven, the result being, for example, 16 potential values of an impedance between the ground terminal and the input terminal 109, as has already been discussed.

Figure 4:
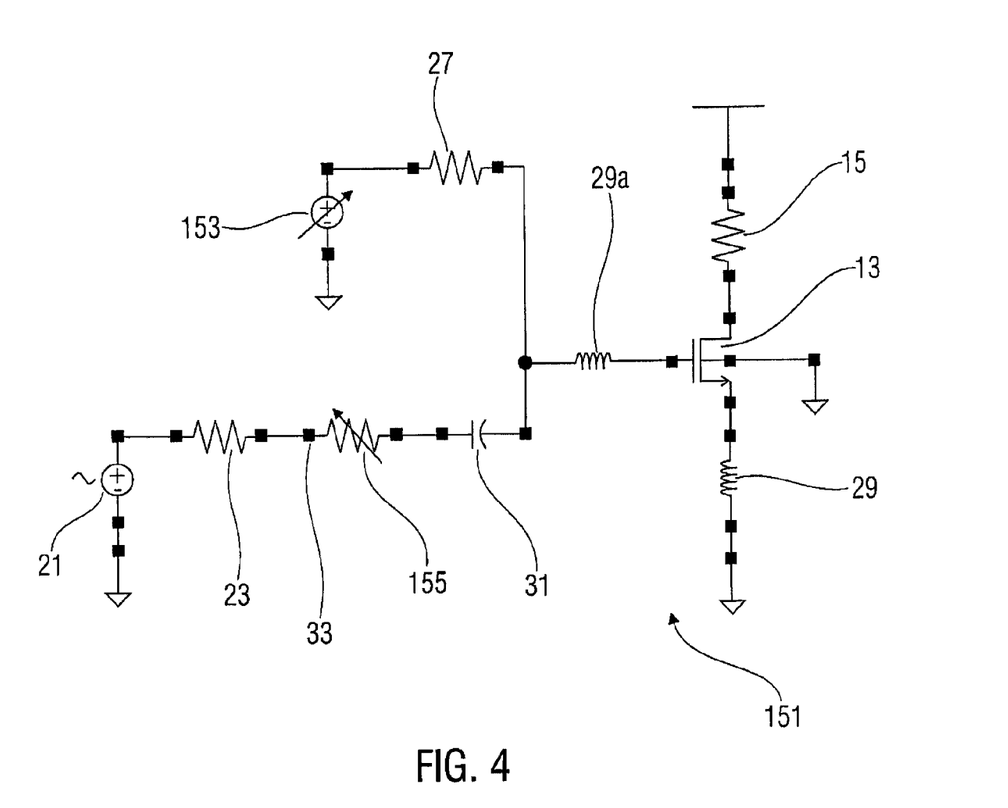
FIG. 4 shows a common-source LNA in accordance with an embodiment of the present invention.

FIG. 4 shows a common-source LNA 151 in accordance with an embodiment of the present invention. In comparison with the potential common-source LNA 24 shown in FIG. 7, the voltage source 25 for specifying the operating point is replaced by an adjustable operating-point voltage source 153.

In addition, in comparison with the potential common-source LNA 24, in the common-source LNA 151 in accordance with an embodiment of the present invention, which is shown in FIG. 4, the input terminal 33 of the common-source LNA is connected to a terminal of the coupling capacitor 31 via a alterable impedance 155.

Via the adjustable operating-point voltage source 153, a potential difference is adjusted between the gate terminal of the field-effect transistor 13 and the source terminal of the field-effect transistor 13, and, thus, the operating point, or the amplification, of the common-source LNA 151 in accordance with an embodiment of the present invention is adjusted. As was already illustrated in formula (5), in the common-source LNA 151, the input impedance Zin is dependent on the transconductance gm and, thus, also on the amplification of the field-effect transistor 13.

By adjusting the alterable impedance 155, for example, by a control means which is not shown here, however, a change in the input impedance of the common-source LNA 151 may be compensated for as a result of an adjustment of the amplification, or of the operating point. The following connection shall apply to the input impedance of the common-source LNA:

$$Z_{in} = Z_{addition} + r_{g,NQS} + \frac{g_m \cdot L_s}{C_{gs}} + \frac{1}{sC_{gs}} + s[L_s + L_g] \quad (12)$$

In the above formula, the variable $Z_{addition}$ represents a value of the alterable impedance 155. Here, the input impedance of the common-source LNA 151 is made up of the value of the alterable impedance 155 as well as the variables already indicated in formula (4). In other words, the input impedance in the common-source LNA 151 is made up of the value of the input impedance of the potential common-source LNA 24 and the value of the alterable impedance 155.

The following connection shall apply to a condition of the input matching, wherein the impedance 23 of the input voltage source is equal to the input impedance of the common-source LNA:

$$Z_{in} = Z_S = Z_{addition} + r_{g,NQS} + \frac{g_m \cdot L_s}{C_{gs}} \quad (13)$$

In this context, the connection which was already set forth in formula (6) shall, in turn, apply to the non-quasi static resistance:

$$r_{g,NQS} = \frac{1}{\kappa \cdot g_m} \quad (14)$$

κ here again represents the Elmore constant and again has the value of 5. The amplification of the circuit then results in accordance with the following formula:

$$G_v = \left| \frac{u_{out}}{u_s} \right| = \frac{1}{2} \cdot \frac{g_m}{\omega \cdot C_{gs}} \cdot \frac{Z_{load}}{Z_S} \quad (15)$$

Figure 5:
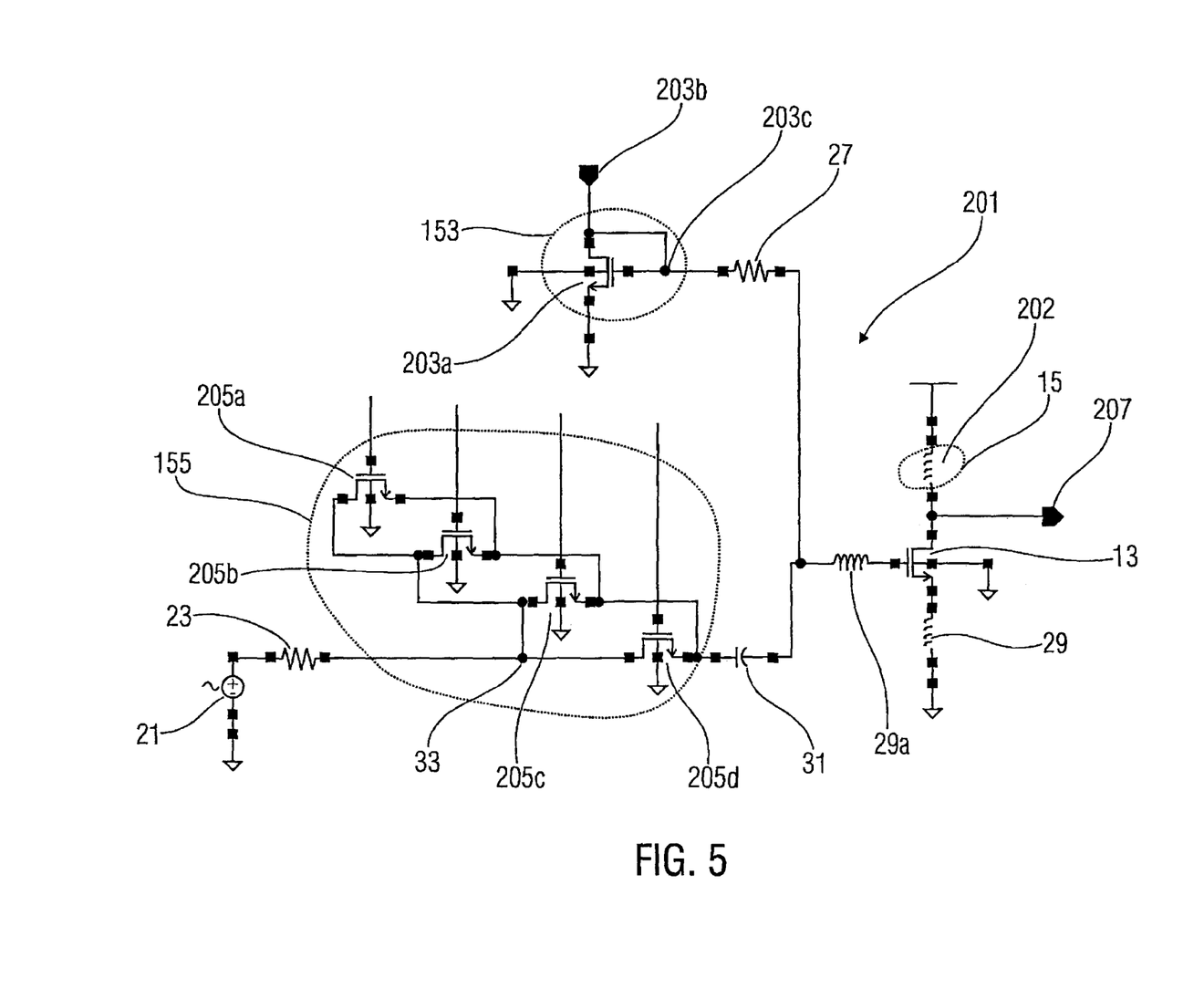
FIG. 5 shows a specific embodiment of the common-source LNA in accordance with an embodiment of the present invention.

FIG. 5 shows a specific implementation 201 of the common-source LNA 151 in accordance with an embodiment of the present invention. In the specific implementation 201 of the common-source LNA, the load impedance 15 is smaller than a load coil 202, and the adjustable operating-point voltage source 153 is implemented in the form of a MOSFET 203a operated as a diode. The MOSFET 203a operated as a diode is connected to a BIAS terminal 203b. The alterable impedance 155 is implemented as a parallel connection of MOSFETs 205a-d in the specific implementation 201 of the common-gate LNA 201. In this context, the MOSFETs 205a-d are connected, at a drain terminal, to the input terminal 33, and, at a source terminal, to a terminal of the coupling capacitor 31, respectively, so that the resistors between the source terminals and drain terminals of the MOSFETs 205a-d are connected in parallel to one another. In this context, gate terminals of the MOSFETs are each connected to an output of a control means not shown here.

In this context, the operating point is adjusted by adjusting the current fed in at the BIAS terminal 203b of the MOSFET diode. The current flows through the MOSFET diode 203a, and within it generates a voltage drop which depends on the current fed in. Thus, the voltage of the adjustable operating-point voltage source 153 and, thus, a potential at the output terminal 203c of the MOSFET diode 203a may be modified by the current at the BIAS terminal 203b.

By changing the potential at the output terminal 203c of the MOSFET diode, the voltage between the gate terminal of the field-effect transistor 13 and the source terminal of the field-effect transistor 13 may again be changed, and thus, the operating point, or the amplification, of the common-gate LNA 201 may be adjusted.

At the same time, however, the input impedance of the common-gate LNA 201 will be changed by the change in the amplification of the common-gate LNA 201.

However, by driving the alterable impedance 155 accordingly, the alterable impedance 155 being implemented in the form of the MOSFETs 205a-d, this change in the input impedance may be compensated for.

The control means which is not shown here may determine, in this context, an amplification to be adjusted, or an adjustment of the operating point of the field-effect transistor 13. To this end, it may advantageously specify the DC operating-point current, or the current which is fed in at the BIAS terminal 203b of the MOSFET diode, and apply a respective gain word, or a combination of bits, to the control inputs or gate terminals of the MOSFETs 205a-d so as to keep the input impedance constant at the same time.

In this context, the control means in the common-source LNA 201 may select a predetermined number of values from a table for adjusting the current at the BIAS terminal 203b, and select an associated gain word from the table.

In the MOSFETs 205a-d, a resistance between the source terminal and the drain terminal may be adjusted as a function of a level of a logical signal applied at the gate terminal, respectively, and provided by the output of the control means not shown. In this context, for example, a resistance between the drain terminal of the MOSFET and a source terminal of the MOSFETs 205a-d will take on a high impedance value at a logically low signal at the gate terminal, and will take on a low impedance value at a logically high signal at the gate terminal.

In this manner, for example, 16 different values of the alterable impedance 155 may be adjusted, by means of the arrangement shown, by the MOSFETs 205a-d connected in parallel to one another, such that the alterable impedance 155 here may have 16 different values.

What is advantageous about the adjustment of the amplification is that the current consumption of the circuit is reduced at a lower amplification.

In above embodiments, adjustment of the amplification and of the input impedance in the amplifier circuits is performed such that advantageously the bandwidth of the circuit is not changed even at different amplifications. However, any adjustments desired of the amplification and of the input impedance are alternatives thereto. In above embodiments, the amplifier circuits are implemented as common-gate LNA or common-source LNA. However, any amplifier circuits, such as operational amplifier circuits, for example, are alternatives thereto.

In above embodiments, the load impedances applied at the output are implemented in the form of load coils or load resistors or ohmic load resistors. However, any implementations of the load impedances, such as, for example, resistive loads or resonant-circuit loads, are alternatives thereto.

In above embodiments, the amplifier element is implemented as a field-effect transistor, but any implementations of the amplifier element, such as, for example, bipolar transistors or operational amplifiers, are alternatives thereto. In above embodiments, the value of the alterable impedance 155 or of the variable impedance 75 is adjusted via a plurality of MOSFETs, a control terminal being connected, respectively, to the gate terminal of the MOSFETs. However, any adjustable impedances are alternatives thereto, such as, for example, potentiometers or variable capacitors.

In above embodiments, four MOSFETs are arranged in the variable impedance 75, or the alterable impedance 155, respectively, both in the specific implementation of the common-gate LNA and in the specific implementation of the common-source LNA. However, any numbers of MOSFETs in the variable impedances, or alterable impedances, are alternatives thereto. In above embodiments, n-MOSFETs are employed for realizing the alterable impedance 155, or the variable impedance 75, but alternatively, it would also be possible to employ p-MOSFETs for this purpose. What is also feasible is a realization of the variable impedance 75, or of the alterable impedance 155, via respectively interconnecting several bipolar transistors.

Also, in above embodiments of the common-gate LNA, the MOSFETs are connected, at the source terminal, to a ground terminal, and, at the drain terminal, to an input terminal of the common-gate LNA 101, respectively, but any arrangements of the MOSFETs and, thus, of the variable impedance 75 are alternatives thereto, as long as the variable impedance 75 is coupled to the input terminal of the common-gate LNA 101. In this context, the source terminal of the MOSFETs could also be connected to a supply voltage terminal or to a terminal which provides a potential which is arbitrarily adjustable.

Also, for realizing the alterable impedance 155, four MOSFETs are arranged in the common-source LNA 201 shown in FIG. 5, but any numbers of MOSFETs 205a-d are alternatives thereto. Additionally, in the common-source LNA, the alterable impedance 155 is arranged between the input terminal and the terminal of the coupling capacitor 31, but any arrangements of the alterable impedance 155 are alternatives thereto, as long as same is coupled to the input terminal of the amplifier circuit.

Alternatively, in the common-source LNA or the common-gate LNA, the ground terminal may be implemented as a supply voltage terminal, and the supply voltage terminals may be implemented as ground terminals.

In above embodiments, a gain word in accordance with which the control means sets a number of four MOSFETs to a high impedance value or a low impedance value between the drain terminal and the source terminal comprises a number of four bits. However, any length of the gain word or any numbers of the bits are alternatives thereto, as a result of which any number of values of the variable impedance 75 or of the alterable impedance 155 may be adjusted.

What is also feasible is that in the embodiments shown in FIG. 3 and FIG. 5, the gate terminal of the MOSFETs has not only a logically high level or a logically low level applied thereto, but in this context, any number of logical levels may be selected as a function of which a respective number of impedance values may then be adjusted between the drain terminal and the source terminal of the MOSFETs.

In above embodiments, the control means, not shown, determines an amplification, to be adjusted, of the amplifier element, and subsequently adjusts the values of the alterable impedance via logical levels of the signals at the gate terminals of the MOSFETs. However, alternatively, the values of the alterable impedance may be adjusted in any manner desired, it also being possible to linearly adjust the value of the alterable impedance 155 or the value of the variable impedance 75 upon any change in the operating point of the field-effect transistor 13. Advantageously, linear adjustment of the values of the variable impedance may be effected as a function of the amplification of the field-effect transistor 13, or of the amplification of the amplifier circuit.

In above embodiments, the control means advantageously determines the amplification, to be adjusted, of the amplifier circuit on the basis of a specific number of potential values of the amplification. It subsequently adjusts a value of the impedance element as a function of the value, to be adjusted, of the amplification. In this context, each value of the amplification advantageously has a specific value of the impedance element associated with it. However, arbitrary associations are also possible, it being possible to associate one value, respectively, of the adjustable impedance with a plurality of amplification values.

What is also feasible here is to adjust the amplification of the amplifier element and to adjust the alterable impedance on the part of the impedance adjustment means in such a manner that the impedance adjustment means determines whether the amplification of the field-effect transistor or of the amplifier element is in a first range or in a second range of the amplifier values, and such that the impedance adjustment means subsequently adjusts the impedance value to have a first value or a second value.

In the common-gate LNA 101 shown in FIG. 3, the control means not shown determines, for example as a function of an output signal, a current to be fed in at the BIAS terminal of the current mirror circuit 103c so as to achieve an amplification, as well as a gain word which here consists of four bits, for example. Further, what is also feasible is to determine the current which is to be fed in at the BIAS terminal 103c, and the gain word as a function of an input signal at an input terminal 109.

In above embodiments, the alterable impedance advantageously is an ohmic resistor, but any alterable impedances, such as reactances, are alternatives thereto.

In above embodiments, the amplifier circuit is implemented as a low-noise amplifier, but any amplifier circuits are alternatives thereto.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. An amplifier circuit, comprising:
an amplifier element having an amplifier element input;
an amplifier adjuster adapted to adjust an amplification of the amplifier element;
an amplifier circuit input coupled to the amplifier element input;
an impedance element comprising a alterable impedance value and being coupled to the amplifier circuit input; and
an impedance adjuster adapted to adjust the impedance value of the impedance element as a function of the amplification of the amplifier element;
the alterable impedance element being coupled, at a first terminal of the alterable impedance element, to the amplifier element input, and is coupled, at a second terminal of the alterable impedance element, to a ground terminal or a supply voltage terminal; and the amplifier element comprising a field-effect transistor having a source terminal, a gate terminal, and a drain terminal, one of the source terminal or drain terminal being coupled to a load impedance, and the other of the source terminal or drain terminal forming the input of the amplifier element, and the gate terminal of the field-effect transistor being coupled to a voltage source, and the amplification adjuster being further adapted to generate an amplification adjustment signal and to adjust, as a function of the adjustment signal, an operating-point current of the field-effect transistor and, thus, the amplification of the amplifier element, and the impedance adjuster being further adapted to receive the amplification adjustment signal, and to adjust the impedance value as a function of the amplification adjustment signal received.

2. The amplifier circuit as claimed in claim 1, wherein the impedance element comprises a plurality of field-effect transistors, the field-effect transistors being connected in parallel and each of the field-effect transistors having a source terminal, a drain terminal, and a gate terminal, and wherein each of the plurality of field-effect transistors is coupled, at the source terminal in each case, to the input of the amplifier element, and is coupled, at the drain terminal, to a ground terminal or a supply voltage terminal, or each of the plurality of field-effect transistors is coupled, at the source terminal in each case, to the ground terminal or to the supply voltage terminal, and is coupled, at the drain terminal in each case, to the input of the amplifier element.

3. An amplifier circuit, comprising:
an amplifier element having an amplifier element input;
an amplifier adjuster adapted to adjust an amplification of the amplifier element;
an amplifier circuit input coupled to the amplifier element input;
an impedance element comprising a variable impedance value and being coupled to the amplifier circuit input; and
an impedance adjuster adapted to adjust the impedance value of the impedance element as a function of the amplification of the amplifier element, wherein
the impedance element comprises a field-effect transistor,
the impedance element is coupled, at a first terminal of the impedance element, to a gate terminal of amplifier element, and is coupled, at a second terminal of the impedance element, to an input of the amplifier circuit, and
the amplification adjuster is further adapted to generate an amplification adjustment signal and, as a function of the amplification adjustment signal, to adjust a potential difference between the gate terminal of the field-effect transistor and a ground or supply voltage potential and, thus, the amplification of the amplifier element, and wherein the impedance adjuster is further adapted to receive the amplification adjustment signal, and to adjust the impedance value as a function of the amplification adjustment signal received.

4. The amplifier circuit as claimed in claim 1, wherein the impedance element adjuster is further adapted to adjust the impedance value such that an input impedance of the amplifier circuit maintains a predetermined value.

5. The amplifier circuit as claimed in claim 1, wherein the impedance element adjuster is further adapted to determine whether the amplification of the amplifier element is within a first range of amplification values or within a second range of amplification values, and to adjust the impedance value to comprise a first or a second predetermined value as a function of whether the amplification is within the first or the second range.

6. The amplifier circuit as claimed in claim 1, wherein the impedance adjuster is further adapted to determine an amplification indication value from which the amplification of the amplifier element may be determined, to look up, with the amplifier indication value, in a table having stored therein an association of amplification indication values with predetermined impedance values of the impedance element, so as to obtain from the table an impedance value which corresponds to the amplification indication value, and so as to adjust the impedance value to comprise the value obtained.

7. The amplifier circuit as claimed in claim 1, wherein the impedance element adjuster is further adapted to receive a plurality of bits, the impedance element comprising a plurality of field-effect transistors which are connected in parallel and each of which comprises a gate terminal, a source terminal and a drain terminal, and each of the bits comprises one of the field-effect transistors associated with it, and the impedance element adjuster is further adapted to adjust a logical signal at the gate terminal to a high level or a low level as a function of the value of the bit associated with the respective field-effect transistor, so as to adjust a value of the resistor between the source terminal and the drain terminal as a function of the level of the logical signal at the gate terminal.

8. The amplifier circuit as claimed in claim 1, wherein the amplifier element comprises an amplifier element input impedance and is adapted such that the amplifier element input impedance changes as a function of the amplification adjusted.

9. The amplifier circuit as claimed in claim 1, wherein the impedance element comprises an ohmic resistor.

10. The amplifier circuit as claimed in claim 1, wherein the amplification adjuster comprises a controllable current source so as to adjust an operating point of the amplifier element.

11. The amplifier circuit as claimed in claim 10, wherein a terminal of the controllable current source is coupled to the amplifier element input.

12. The amplifier circuit as claimed in claim 3, wherein the amplification adjuster comprises a variable voltage source which is coupled, at a first terminal of the variable voltage source, to the gate terminal of the field-effect transistor, and, at a second terminal, to the ground terminal or voltage supply terminal.

13. The amplifier circuit as claimed in claim 3, wherein the impedance element comprises a plurality of field-effect transistors, the plurality of field-effect transistors being arranged such that source terminals of the field-effect transistors are coupled to one another, respectively, and drain terminals of the field-effect transistors are coupled to one another, respectively, so that channel resistors between the source terminals and the drain terminals of the field-effect transistors are arranged in a parallel connection to one another.

14. The amplifier circuit as claimed in claim 3, wherein one of a source terminal or of a drain terminal of the field-effect transistor is coupled to a load impedance, and the other of the source or drain terminals being coupled to a ground terminal or supply voltage terminal via an inductance, and the gate terminal forming an input of the amplifier element.

* * * * *